United States Patent
Hu et al.

(10) Patent No.: US 10,930,634 B2
(45) Date of Patent: Feb. 23, 2021

(54) INTEGRATED CIRCUIT SYSTEM AND PACKAGING METHOD THEREFOR

(71) Applicant: SHENZHEN XIUYUAN ELECTRONIC TECHNOLOGY CO., LTD, Shenzhen (CN)

(72) Inventors: Chuan Hu, Chandler, AZ (US); Junjun Liu, Albany, NY (US); Yuejin Guo, Phoenix, AZ (US); Edward Rudolph Prack, Phoenix, AZ (US)

(73) Assignee: SHENZHEN XIUYUAN ELECTRONIC TECHNOLOGY CO., LTD, Guangdong (CN)

( * ) Notice: Subject to any disclaimer, the term of this patent is extended or adjusted under 35 U.S.C. 154(b) by 7 days.

(21) Appl. No.: 16/465,455

(22) PCT Filed: Nov. 30, 2016

(86) PCT No.: PCT/CN2016/107835
§ 371 (c)(1),
(2) Date: May 30, 2019

(87) PCT Pub. No.: WO2018/098651
PCT Pub. Date: Jun. 7, 2018

(65) Prior Publication Data
US 2020/0006310 A1 Jan. 2, 2020

(51) Int. Cl.
*H01L 25/00* (2006.01)
*H01L 21/56* (2006.01)
(Continued)

(52) U.S. Cl.
CPC .......... *H01L 25/50* (2013.01); *H01L 21/565* (2013.01); *H01L 21/568* (2013.01);
(Continued)

(58) Field of Classification Search
CPC ..... H01L 25/50; H01L 21/565; H01L 21/568; H01L 23/3185; H01L 23/49805;
(Continued)

(56) References Cited

U.S. PATENT DOCUMENTS

2010/0052187 A1 4/2010 Lee et al.
2017/0179096 A1* 6/2017 Dang et al.

FOREIGN PATENT DOCUMENTS

CN 101106094 * 1/2008
CN 101106094 A 1/2008
(Continued)

OTHER PUBLICATIONS

Search Report and Written Opinion for PCT/CN2016/107835 dated Jul. 28, 2017 including translation.

*Primary Examiner* — Karen Kusumakar
(74) *Attorney, Agent, or Firm* — Billion & Armitage

(57) ABSTRACT

An integrated circuit system and a packaging method therefor are disclosed. The method includes providing a first carrier and a second carrier oppositely, with a first device set of the first carrier and a second device set of the second carrier both located between the first and second carriers, providing a molding material between the first and second carriers to make the first and second device sets respectively in contact with the molding material, curing the material to make the first and second device sets respectively mounted at two sides of the molding material, making the first and second carriers detached from the first device set and the molding material and from the second device set and the molding material respectively; and forming connection holes in the molding material and fabricating a conductive layer which extend into the connection holes to electrically connect the first and second device sets.

19 Claims, 5 Drawing Sheets

(51) Int. Cl.
  *H01L 23/31* (2006.01)
  *H01L 23/498* (2006.01)
  *H01L 25/16* (2006.01)
  *H01L 25/18* (2006.01)

(52) U.S. Cl.
  CPC .... *H01L 23/3185* (2013.01); *H01L 23/49805* (2013.01); *H01L 25/162* (2013.01); *H01L 25/18* (2013.01)

(58) Field of Classification Search
  CPC ................. H01L 25/162; H01L 25/18; H01L 2224/24137; H01L 24/96; H01L 2924/181; H01L 25/10; H01L 23/552; H01L 24/82; H01L 24/24; H01L 2224/96
  See application file for complete search history.

(56) References Cited

FOREIGN PATENT DOCUMENTS

| | | | |
|---|---|---|---|
| CN | 103137613 | * | 6/2013 |
| CN | 103137613 A | | 6/2013 |
| TW | 201523746 A | | 1/2015 |

* cited by examiner

INTEGRATED CIRCUIT SYSTEM AND PACKAGING METHOD THEREFOR

TECHNICAL FIELD

The disclosure belongs to the field of electronics, and in particular relates to an integrated circuit system and a packaging method.

BACKGROUND ART

The conventional multi-component or multi-chip system packaging are typically packaging in system units. A plurality of electronic components or chips, which constitutes a system, are flip-chipped or wire-bonded onto one surface or one side of a substrate containing circuits thereinside, and then encapsulated in a molded plastic, which is then soldered or plugged into a circuit board together with other required electronic components or chips, to form a fully-functional integrated circuit system. Since it is often required to be connected to the circuit port of the substrate by wire bonding or flip-chipping, and then connected to the circuit board, the amount of used materials are large, the process is complicated, and the production cost is high; moreover, using a large number of materials with different characteristics may also easily induce a variety of thermomechanical stress problems at the interfaces of the different materials.

SUMMARY

Based on this, the present disclosure overcomes the deficiencies of the prior art, and provides an integrated circuit system and a packaging method, which can enable integrating more devices on an integrated circuit system and obtaining stronger functions and achieve a small overall volume of the system, high production efficiency and low cost.

Its technical solutions are as follows:

An integrated circuit system packaging method includes the steps of: curing, in which a first carrier and a second carrier are oppositely provided, a first device set on the first carrier and a second device set on the second carrier are both located between the first carrier and the second carrier, a molding material is provided between the first carrier and the second carrier, the first device set and the second device set are respectively in contact with the molding material, and the molding material is cured such that the first device set and the second device set are respectively mounted at two sides of the molding material; detaching, in which the first carrier is detached from the first device set and the molding material, and the second carrier is detached from the second device set and the molding material; connecting (wiring), comprising forming connection holes in the molding material, and forming a conductive layer in such a way that the conductive layer extends into the connection holes, so that the conductive layer enables the first device set to be connected with the second device set.

In one embodiment, the first device set is mounted at the first carrier by a thermosensitive adhesive material, and in the detaching step, the thermosensitive adhesive material is heated or cooled to make the first carrier detached from the first device set; or/and the second device set is mounted at the second carrier by a thermosensitive adhesive material, and in the detaching step, the thermosensitive adhesive material is heated or cooled to make the second carrier detached from the second device set.

In one embodiment, the integrated circuit system packaging method further includes: in the curing step, an intermediate layer is provided between the first carrier and the second carrier, such that the molding material is distributed between the first carrier and the intermediate layer, and between the second carrier and the intermediate layer, and the molding material is cured such that the intermediate layer is embedded in the molding material.

In one embodiment, the intermediate layer is embodied as a flexible circuit board; or the intermediate layer is formed by stacking at least two layers of flexible circuit boards; or the intermediate layer is a shielding layer; or the intermediate layer itself constitutes an electronic component, to make the intermediate layer electrically connected to the first device set or the second device set.

In one embodiment, the intermediate layer is provided with a base circuit layer, wherein the base circuit layer is electrically connected to the first device set or the base circuit layer is electrically connected to the second device set.

In one embodiment, the molding material is a silicone molded plastic, or a molded resin.

In one embodiment, the integrated circuit system packaging method further includes: making the first device set, the second device set and the molding material constitute a substrate, and fabricating, after the detaching step, a first circuit layer and a second circuit layer at two sides of the substrate, in such a way that the first circuit layer is electrically connected to the first device set, and the second circuit layer is electrically connected to the second device set.

In one of the embodiments, the pins of the devices of the first device set are oriented toward the first carrier, and the pins of the devices of the second device set are oriented toward the second carrier.

In one embodiment, the first circuit layer is provided with a first connection port, and devices are mounted on the first circuit layer, such that the devices are electrically connected to the first connection port; or the second circuit layer is provided with a second connection port, and devices are mounted on the second circuit layer, such that the devices are electrically connected to the second connection port.

In one embodiment, the integrated circuit system packaging method further includes: before the curing step, fabricating a first circuit layer on the first carrier, and providing a first device set on the first circuit layer, wherein the first circuit layer is electrically connected to the first device set, and in the detaching step, making the first circuit layer and the first device set both detached from the first carrier, wherein the first circuit layer and the first device set are together mounted on the molding material; or/and, before the curing step, forming a second circuit layer on the second carrier and providing a second device set on the second circuit layer, wherein the second circuit layer is electrically connected to the second device set, and in the detaching step, making the second circuit layer and the second device set both separated from the first carrier, wherein the second circuit layer and the second device set are together mounted on the molding material.

In one embodiment, the first device set, the second device set and the molding material constitute a substrate having an area greater than 10,000 square centimeters.

In one embodiment, the first device set or/and the second device set includes invalid device(s) configured for making uniform a density that devices in the first device set or/and the second device set are distributed and avoiding warpage of the molding material.

In one embodiment, the first device set and the second device set are staggered at two sides of the molding material, so as to make uniform the density of devices in the first device set and the second device set, are distributed and avoid warpage of the molding material.

In one embodiment, at least two first device sets are provided at the first carrier, and at least two second device sets are provided at the second carrier, and after the curing step, the detaching step and the connecting step, the first device set, the second device set and the molding material constitute a substrate, and the substrate is cut into at least two circuit boards.

In one of the embodiments, the first device set includes at least one device, and the second device set includes at least one device, the device being a chip or a separate electronic component.

An integrated circuit system comprises: a first device set detached from a first carrier, a second device set detached from a second carrier, and a cured molding material, wherein the molding material is located between the first device set and the second device set, the first device set and the second device set are in contact with the molding material, and the first device set and the second device set are respectively mounted at two sides of the molding material, the molding material is provided with connection holes and a conductive layer, the conductive layer extends into the connection holes, and the conductive layer enables the first device set to be electrically connected to the second device set.

In one embodiment, the molding material is a silicone molded plastic, or a molded resin.

In one embodiment, the first device set, the second device set, and the molding material constitute a substrate, and a first circuit layer and a second circuit layer are provided at two side of the substrate respectively, the first circuit layer is electrically coupled to the first device set, and the second circuit layer is electrically coupled to the second device set.

In one embodiment, the first circuit layer is provided with a first connection port, devices are mounted onto the first circuit layer, and the devices are electrically connected to the first connection port; or, the second circuit layer is provided with a second connection port, devices are mounted onto the second circuit layer, and the devices are electrically connected to the second connection port.

In one embodiment, the integrated circuit system further includes an intermediate layer provided between the first device set and the second device set, the intermediate layer being embedded in the molding material.

In one embodiment, the intermediate layer is embodied as a flexible circuit board; or the intermediate layer is formed by stacking at least two layers of flexible circuit boards; or the intermediate layer is a shielding layer; or the intermediate layer itself constitutes an electronic component to make the intermediate layer electrically connected to the first device set or the second device set.

In one embodiment, the intermediate layer is provided with a base circuit layer, wherein the base circuit layer is electrically connected to the first device set or the base circuit layer is electrically connected to the second device set.

In one of the embodiments, the first device set includes at least one device, and the second device set includes at least one device, the device being a chip or a separate electronic component.

In one of the embodiments, the first device set or/and the second device set includes an invalid device. The invalid device is used to equalize the density of the devices of the first device set or/and the second device set distributed on two sides of the molding material to avoid warpage of the molding material.

The beneficial effects of the present disclosure comprise:

1. The integrated circuit system packaging method includes the steps of: (1) curing, in which a first carrier and a second carrier are oppositely provided, and a first device set on the first carrier and a second device set on the second carrier are both located between the first carrier and the second carrier, a molding material is provided between the first carrier and the second carrier, and the first device set and the second device set are respectively in contact with the molding material, and the molding material is cured such that the first device set and the second device set are respectively mounted at two sides of the molding material; (2) detaching, in which the first carrier is detached from the first device and the molding material, and the second carrier is detached from the second device set and the molding material; (3) connecting comprising: forming connection holes in the molding material, and forming a conductive layer in such a way that the conductive layer extends into the connection holes, so that the conductive layer enables the first device set to be electrically connected to the second device set. The portions of the conductive layer that extends into the connection holes may be attached only to the inner walls of the connection holes, or may completely or partially fill the connection holes.

Traditionally, devices can only be placed on a single side of the circuit board. During the curing process of an encapsulation layer, due to the large difference in thermal expansion coefficients of various materials, a large thermal stress is generated at the junction of the chip and the substrate, which affects the mechanical reliability of the chip system. In order to ensure the mechanical properties of the system, the mechanical properties of the substrate have to be enhanced, resulting in that a thicker substrate has to be used and that the overall system size is thus increased. In the newer fan-out system packaging technology, because the chips of multiple systems need to be processed simultaneously on a large-sized panel, during the curing process of the encapsulation layer, warpage of the panel may be easily caused due to difference in the thermal expansion coefficients of the encapsulation layer material, the chip material and the substrate material, seriously affecting the yield of the process and limiting the line width accuracy that can be achieved. In the present disclosure, the substrate may be omitted, and the first device set and the second device set are respectively provided on two sides of the molding material, thus the devices accommodated are greatly increased, and the devices at the two sides can be electrically connected to each other through the connection holes. The number of the connection points that the devices can use on the surfaces of the two sides is increased, the transmission bandwidth and the operation speed are increased, and high system integration is obtained. Moreover, the devices at two sides of the molding material are electrically connected by means of the connection holes, and the connection holes are provided in the molding material without occupying extra space; in particular, for ultra-thin circuit boards, flexible circuit boards, and circuit boards of wearable devices, and the like, the method of the present disclosure can well maintain the overall ultra-thin, flexible characteristics of the obtained integrated circuit system.

The cured molding material plays a role of supporting and fixing. During the curing of the molding material, the first device set and the second device set are simultaneously mounted on the molding material, and the devices of the device sets are symmetrically placed on the two outer surfaces of the molding material, thus reducing the thermo-mechanical stress, which is of great significance for parallel processing on large-size panels.

The traditional system packaging process may rearrange the devices on a carrier to form a large-sized panel or wafer, and then the molding material is placed for encapsulation. After the molding material is cured, the molding material containing all the devices is completely detached and used as a new substrate for subsequent processes. Because of the large difference in thermo-mechanical properties between the device material silicon and the molding material, after being cured and detached from the carrier, the substrate will have large warpage, which seriously affects the implementation of the subsequent processes. In the present disclosure, the first device set and the second device set are respectively mounted at two sides of the molding material, and the density of the devices at the two sides is kept as uniform and symmetrical as possible, so that the warpage of the substrate formed after the molding material is cured can be effectively reduced.

Moreover, the first device set and the second device set are provided on the first carrier and the second carrier, and the flow operation is performed on the large-area panel, so that the processes involved are simple and the production efficiency is high. Moreover, by using the first carrier and the second carrier, it is ensured that the two outer surfaces of the molding material after detachment are flat, and can be subjected to subsequent processes without additional surface planarization treatment.

2. The first device set is mounted to the first carrier by a thermosensitive adhesive material, and in the detaching step, the thermosensitive adhesive material is heated or cooled to cause the first carrier detached from the first device set; or/and the second device set is mounted to the second carrier by a thermosensitive adhesive material, and in the detaching step, the thermosensitive adhesive material is heated or cooled to make the second the carrier detached from the second device set. If necessary, the thermosensitive material may be used to adhere the first device set, or the second device set, or simultaneously adhere the first device set and the second device set, and when heated or cooled, the first carrier is detached, or the second carrier is detached, or the first carrier and the second carrier are simultaneously detached for being ready for the connecting step. The use of a thermosensitive material reduces the mechanical stress of the detachment step, without damaging the device sets or scratching the detachment surface.

3. In the curing step, an intermediate layer is provided between the first carrier and the second carrier, in a such way that the molding material is distributed between the first carrier and the intermediate layer, and between the second carrier and the intermediate layer, and the molding material is cured such that the intermediate layer is embedded in the molding material without occupying extra space. Adding an intermediate layer before the molding material is cured can improve the performance of the integrated circuit system, and can impart different characteristics to the intermediate layer as needed, so that the final highly-integrated circuit system can obtain better characteristics. For example, the intermediate layer can be a carrier for a circuit layer, and can improve the integration degree of the integrated circuit system after being electrically connected.

4. The intermediate layer is a flexible circuit board; or, the intermediate layer is formed by stacking at least two layers of flexible circuit boards; and the circuit board is provided between the molding materials as an intermediate layer to expand the function of the entire integrated circuit system. The use of a flexible circuit layer and the use of the integrated circuit system packaging method of the present disclosure enable a very thin system, and the resulting system as a whole can still maintain flexible performance.

Alternatively, the intermediate layer is a shielding layer; and the first device set and the second device set at the two sides of the molding material are prevented from interfering with each other, to ensure the working performance of the entire integrated circuit system.

Alternatively, the intermediate layer itself constitutes an electronic component to make the intermediate layer electrically connected to the first device set or the second device set, the electronic component including but not limited to antennas, capacitors, etc., which can extend the circuit function, and does not occupy extra space.

5. The intermediate layer is provided with a base circuit layer, and in the step of connecting, through connection holes, the base circuit layer may be electrically connected to the first device set, or/and the base circuit layer may be electrically connected to the second device set. The first device set, the second device set, and the intermediate layer form a structure similar to a multilayer circuit, which can increase circuit functions. The base circuit layer may be provided at one side of the intermediate layer facing the first device set, or one side thereof facing the second device set, or may be embedded in the intermediate layer, or both sides of the intermediate layer are provided with circuit layers.

6. The molding material is a moldable packaging material such as silicone molded plastic ($R_2SiO_x$) or a molded resin, including, but not limited to, polyimide, polydimethylsiloxane, or parylene. These materials have good fluidity, can fill the gap between the first carrier and the second carrier, and the curing operation is simple, facilitating production.

7. The method further includes: forming a substrate, by the first device set, the second device set and the molding material after curing, and forming, after the detaching step, a first circuit layer and a second circuit layer at two sides of the substrate respectively, wherein the first circuit layer is electrically connected to the first device set and the second circuit layer is electrically connected to the second device set. The first circuit layer, the first device set, the second circuit layer, and the second device set are electrically connected to expand the circuit function. As required, when the first device set is provided on the first carrier, partial electrical connection may be present between the first device sets in advance, and increase of the first circuit layer may extend the original connection; or there may be no electrical connection present between the first device sets in advance, and electrical connection is made through the first circuit layer. When the second device set is provided at the second carrier, partial electrical connection may be present between the second device sets in advance, and increase of the second circuit layer may extend the original connection; or there may be no electrical connection present between the first device sets in advance, and electrical connection is achieved through the second circuit layer.

8. The pins of the devices of the first device set face the first carrier, and the pins of the devices of the second device set face the second carrier. After the detachment step, the pins of the devices are naturally exposed at the two sides of the substrate, so that the first circuit layer and the second circuit layer are separately formed at the two sides of the substrate, wherein the first circuit layer is electrically coupled to the first device set, and the second circuit layer is electrically connect to the second device set. In this way, the first circuit layer may be directly formed on the surface of the molding material, or after the first circuit layer is provided at another circuit board, the first device set is electrically connected to the first circuit layer of the circuit board through the pins of the devices; and the second circuit layer may be directly formed on the surface of the molding material, or after the second circuit layer is provided at another circuit board, the second device set is electrically connected to the second circuit layer of the circuit board through the pins of the devices.

9. Before the curing step, a first circuit layer is fabricated on the first carrier, and a first device set is provided on the first circuit layer, the first circuit layer being electrically connected to the first device set; and in the step of detaching, the first circuit layer and the first device set are both separated from the first carrier, and the first circuit layer and the first device set are together mounted on the molding material; or/and, before the curing step, a second circuit layer is fabricated on the second carrier, a second device set is provided on the second circuit layer, the second circuit layer being electrically connected to the second device set; and in the detaching step, the second circuit layer and the second device set are both detached from the first carrier, and the second circuit layer and the second device set are together mounted on the molding material.

The above "or/and" means that, as needed, by using the aforementioned method, the first circuit layer may be separately fabricated, or the second circuit layer may be separately fabricated, or the first circuit layer and the second circuit layer may be simultaneously formed. For example, the method of simultaneously fabricating the first circuit layer and the second circuit layer comprises: before placing the first device set and the second device set on the first carrier and the second carrier respectively, providing the first circuit layer and the second circuit layer respectively on the first carrier and the second carrier in advance, which are respectively corresponding to the first device set and the second device set, wherein the placing process comprises making the first device set and the second device set respectively aligned with and connected to the circuit layer and the second circuit layer, so that the first circuit layer is electrically connected to the first device set, and the second circuit layer is electrically connected to the second device set. After the electrical connection is consolidated by appropriate thermal or chemical treatment, the steps of curing, detaching, and connecting are continued, except that it is no longer necessary to fabricate additional circuit layers at the outer surfaces of two sides of the substrate formed after detachment, and only connection holes for connecting the first circuit layer and the second circuit layer are required to be formed. In this case, the adhesive material is provided between the first carrier and the first circuit layer and between the second carrier and the second circuit layer, so that after the detachment, the first circuit layer and the second circuit layer may be kept at the two outer surfaces of the formed substrate. In the fabrication method, the circuit layer is formed before the molding material is cured, and the first circuit layer and the second circuit layer are fabricated on the surfaces of the first carrier and the second carrier which are generally more flat and stronger than the molding material, thus connecting in which the line width and distance are smaller can be more easily fabricated and the bandwidth and speed of data communication can be increased. Since the electrical connection is consolidated before the molding material is cured, drifting of the relative position of the chip during the curing process can be avoided, resulting in a huge difficulty in electrical connection of the circuit layer.

10. The first circuit layer is provided with a first connection port, and the devices are mounted onto the first circuit layer to make the devices electrically connected with the first connection port. The first circuit layer has an extended function due to the pre-provided first connection port for expansion, and after the first circuit layer is fabricated, the device can be mounted according to different needs, wherein the device can be a chip or an electronic component.

Alternatively, the second circuit layer is provided with a second connection port, and the devices are mounted onto the second circuit layer to make the devices electrically connected to the second connection port. The second circuit layer has an extended function due to the pre-provided second connection port for expansion, and after the second circuit layer is fabricated, the device can be mounted according to different needs, wherein the device can be a chip or an electronic component. The chip is a bare die or a chip with packaged bare die.

11. The first device set includes at least one device, and the second device set includes at least one device, the device being a chip or a separate electronic component. After completing a fabrication process, it is possible to complete the installation of chips and electronic components at the same time, achieving high efficiency. The first device set and the second device set each comprise more than one device, and the devices of the same set are all provided on the carrier, and are together subjected to installation and parallel processing through the steps of curing, detaching and connecting, achieving high efficiency.

12. At least two first device sets are provided on said first carrier; at least two second device sets are provided on said second carrier; after said curing step, said detaching step and said connecting step, the first device set, the second device set, and the molding material constitute a substrate; and the substrate is cut into at least two circuit boards. First, the devices of the first device set and the second device set are mounted with a plurality of the first device sets and the second device sets are simultaneously fixedly mounted by the molding material, the connection holes and the conductive layer are simultaneously fabricated, and finally it is cut into circuit boards of a desired size, achieving high production efficiency.

Alternatively, there may be at least two first device sets, and there may be at least two second device sets, and each of the circuit boards includes at least one of the first device set or at least one of the second device sets. It is also possible to provide only one first device set or only one second device set, and if necessary, the different circuit boards after cutting respectively comprise several devices in the first device set, or include several devices in the second device set.

13. The area of the substrate is greater than 10,000 square centimeters. According to the integrated circuit system package structure and method of the present disclosure, a large-plane circuit board may be fabricated to avoid warpage, ensuring the performance of a large-plane circuit board, and at the same time reducing the cost of fabricating a large-plane circuit board. A large-sized substrate composed of a first device set, a second device set, and a molding material can be fabricated, and at the same time, warpage of the large-sized substrate can be avoided simultaneously, ensuring quality and possibility of continuing the subsequent processes on the large substrate and reducing production costs.

14. The first device set or/and the second device set includes an invalid device, and the invalid device is used to make uniform the density of the devices of the first device set or/and the second device set are distributed at two sides of the molding material to avoid warpage of the molding material. The device composition of the first device set and the second device set is often determined by the function to be implemented, and the size, dimension, and number may vary greatly. If only valid devices are used, different thermo-mechanical stresses may be present at two sides of the formed substrate due to uneven device material distribution and there may be warpage during the fabrication process. As needed, the invalid device may be set separately in the first device set, or the invalid device may be separately set in the second device set, or the invalid device may be set in both the first device set and the second device set. In the present disclosure, in addition to setting the first device set and the second device set to realize the circuit function of the whole system, an invalid chip is further added, and the invalid chip can offset the difference in volume and occupied area between different devices, enabling uniform device occupied density of the entire molding material surface, further reducing the warpage, reducing the difficulty of the fabrication process, and improving the fabrication precision of the connecting circuit layer. Especially for large-size substrates, the use of invalid devices can greatly reduce the possible warpage of large-sized substrates during the fabrication process.

15. The first device set and the second device set are staggered at two sides of the molding material, so that the density that the devices of the first device set and the second device set are distributed at the two sides of the molding material is uniform, thereby avoiding warpage of the molding material. The device sets are staggered on the surface of the molding material to avoid possible warpage of the formed large-sized substrate during the fabrication process. The device composition of the first device set and the second device set is often depended on the function to be implemented, and the size, dimension and number may vary greatly. If only valid devices are used, the number of device sets placed increases as the size of the formed substrate increases. If only the same device set is placed on the same side of the substrate, different thermo-mechanical stresses at two sides of the formed substrate caused by the uneven distribution of the device materials is increased accordingly, and during the fabrication process, the warpage of the substrate will also increase. In the present disclosure, the first device set and the second device set may be arranged in a staggered way on the first carrier and the second carrier, so that the device density at the two sides of the finally formed substrate is more uniform, the stresses at the two sides of the substrate after detachment of the first carrier and the second carrier is more symmetrical, and the warpage is less likely to occur. The warpage of the formed large-sized substrate during the fabrication process can be reduced, the difficulty of the fabrication process can be reduced, and the fabrication precision of the connecting circuit layer can be improved.

Figure 1:
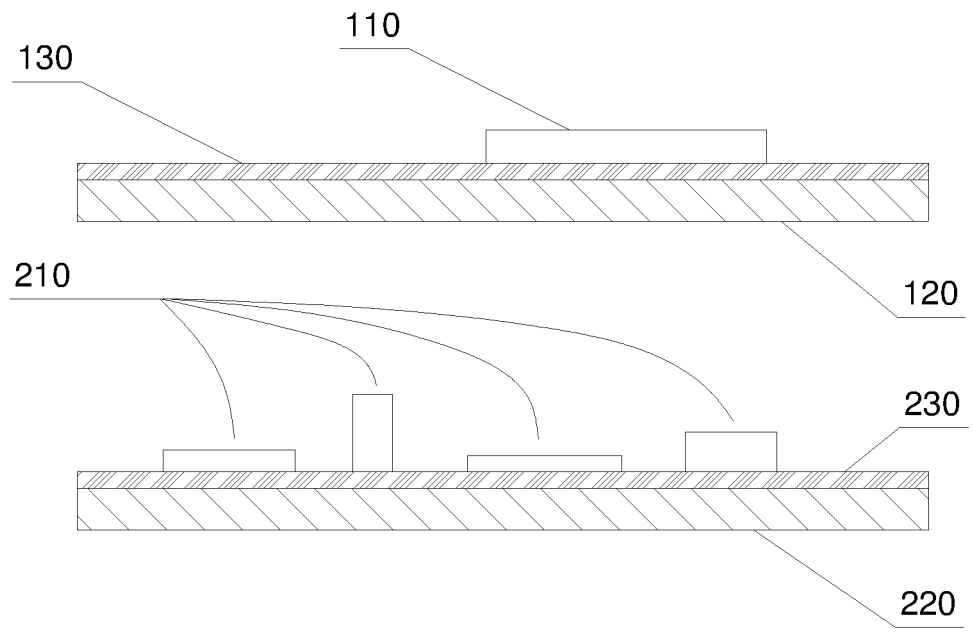
FIG. 1 is a schematic structural diagram 1 of a chip packaging method according to embodiments of the present disclosure.

REFERENCE SIGNS 110, first device set, 120, first carrier, 130, 230, thermo-sensitive adhesive material, 140, first circuit layer, 210, second device set, 220, second carrier, 240, second circuit layer, 300, molding material, 310, connection hole, 400, conductive layer, 500, intermediate layer, 510, base circuit layer.

DETAILED DESCRIPTION OF EMBODIMENTS

The present disclosure will be further described in detail below, but embodiments of the disclosure are not limited thereto.

The integrated circuit system includes: a first device set 110 detached from a first carrier 120, a second device set 210 detached from a second carrier 220, and a cured molding material 300 as shown in FIGS. 1 to 6, wherein the molding material 300 is located between the first device set 110 and the second device set 210, the first device set 110 and the second device set 210 are in contact with the molding material 300, and the first device set 110 and the second device set 210 are respectively mounted at two sides of the molding material 300, the molding material 300 is provided with connection holes 310 and a conductive layer 400, the conductive layer 400 extends into the connection holes 310, and the conductive layer 400 enables the first device set 110 to be electrically connected with the second device set 210. The conductive layer 400 extending into the connection holes 310 may be attached only to the inner walls of the connection holes 310, or may completely or partially fill the connection holes 310. Here, the case where the conductive layer 400 is attached only to the inner walls of the connection holes 310 is as shown in FIG. 7.

Figure 6:
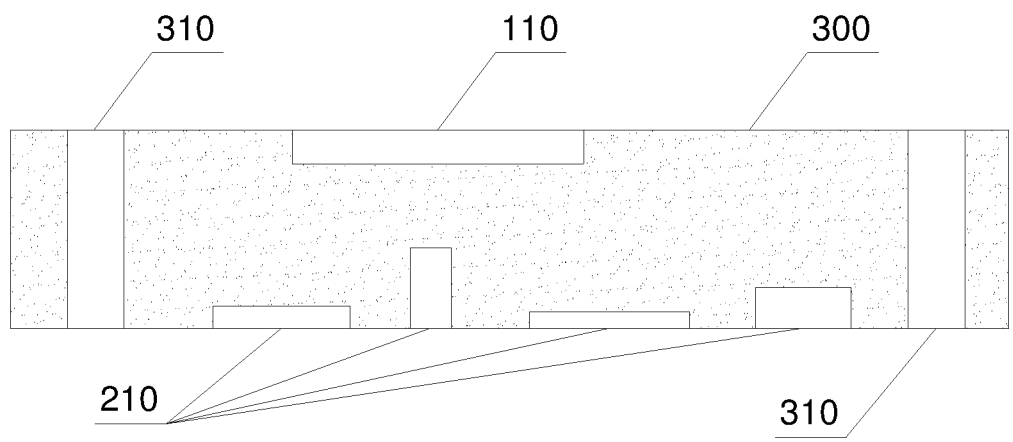
FIG. 6 is a schematic structural diagram 6 of a chip packaging method according to embodiments of the present disclosure.
Figure 7:
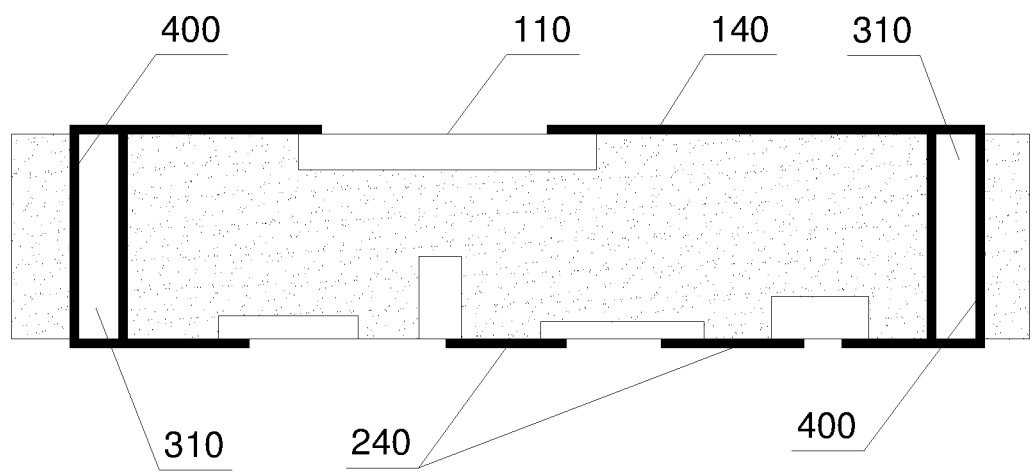
FIG. 7 is a schematic structural diagram 7 of a chip packaging method according to embodiments of the present disclosure.

As shown in FIG. 6, the first device set 110, the second device set 210, and the molding material 300 constitute a substrate, and the first circuit layer 140 and the second circuit layer 240 are respectively provided at two sides of the substrate, and the first circuit layer 140 is electrically connected to the first device set 110, and the second circuit layer 240 is electrically connected to the second device set 210.

An intermediate layer 500 is provided between the first carrier 120 and the second carrier 220, and the intermediate layer 500 is embedded in the molding material 300. The intermediate layer 500 is provided with a base circuit layer 510, wherein the base circuit layer 510 is electrically connected to the first device set 110 or the base circuit layer 510 is electrically connecting to the second device set 210. The base circuit layer 510 may be provided on two sides of the intermediate layer 500, or the base circuit layer 510 may be provided only on one of the sides. The first device set 110, the second device set 210 and the intermediate layer 500 form a structure similar to a multilayer circuit, which can increase circuit functions. The base circuit layer 510 may be provided on one side of the intermediate layer 500 facing the first device set 110, or one side facing the second device set 210, or may be embedded in the intermediate layer 500, or the two sides of the intermediate layer 500 are both provided with circuit layers. It is not limited to the embodiment, and alternatively, the intermediate layer 500 may be a flexible circuit board; or, the intermediate layer 500 may be formed by stacking at least two layers of flexible circuit boards; and the circuit board is provided between the molding materials 300 as the intermediate layer 500, extending the function of the whole integrated circuit system. The use of a flexible circuit layer and the use of the integrated circuit system packaging method of the present disclosure enable a very thin system, and the resulting system as a whole can still maintain flexible performance. Alternatively, the intermediate layer 500 is a shielding layer; and the first device set 110 and the second device set 210 on the two sides of the molding material 300 are prevented from interfering with each other, to ensure the working performance of the entire integrated circuit system. Alternatively, the intermediate layer 500 itself constitutes an electronic component that electrically connects the intermediate layer 500 with the first device set 110 or the second device set, the electronic component including but not limited to antennas, capacitors, etc., which can extend the circuit function, and does not occupy extra space.

The molding material 300 is a moldable packaging material such as silicone molded plastic ($R_2SiO_x$) or a molded resin including, but not limited to, polyimide, or polydimethylsiloxane, or parylene, as needed. These materials have good fluidity, can fill the gap between the first carrier 120 and the second carrier 220, and the curing operation is simple, which is advantageous for production.

In addition, the first circuit layer 140 is provided with a first connection port, the first circuit layer 140 is mounted with a device, and the device is electrically connected to the first connection port; or the second circuit layer 240 is provided a second connection port, the second circuit layer 240 is mounted with a device, and the device is electrically connected to the second connection port. The first connection port and the second connection port are not shown in the figures.

The first device set 110 includes at least one device, and the second device set 210 includes at least one device, the device being a chip or a separate electronic component. Among them, electronic components include, but not limited to, a store owner, a capacitor, an inductor, a triode, and a diode. After completing the fabrication process, it is possible to complete the installation of chips or electronic components at the same time, achieving high efficiency. The first device set 110 and the second device set 210 comprise more than one device, and the devices of the same set are provided on the carrier, and are together subjected to installation and parallel processing through the steps of curing, detaching, and connecting, achieving high efficiency.

The first device set 110 or/and the second device set 210 includes an invalid device, with the invalid device configured for equalizing the density of the devices of the first device set 110 or/and the second device set 210 in the molding material 300 and avoiding warpage of the molding material 300.

The area of the substrate is greater than 10,000 square centimeters. According to the integrated circuit system packaging method of the present disclosure, a large-plane circuit board can be fabricated to avoid warpage, ensuring the quality and possibility of continuing the subsequent processes on the large substrate, and reducing the fabrication cost.

Figure 2:
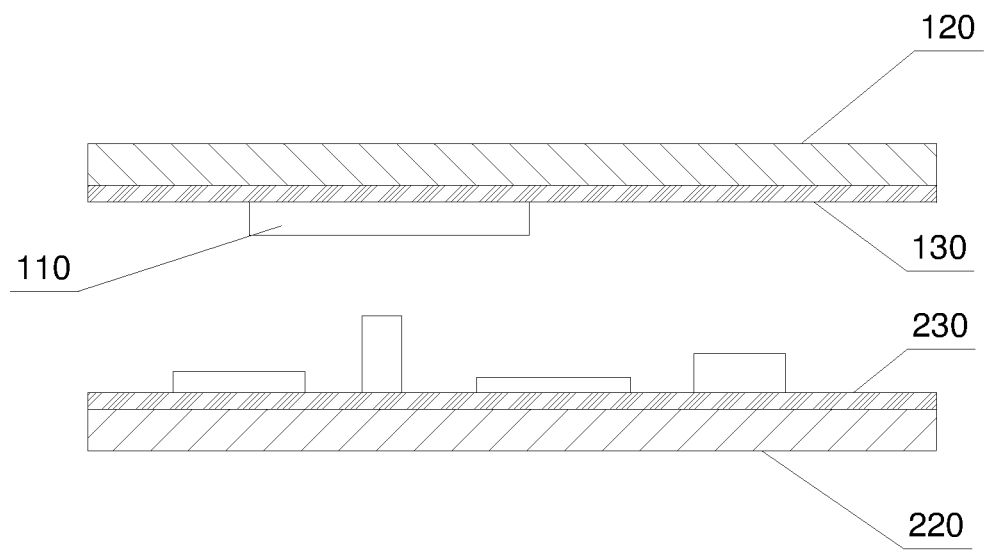
FIG. 2 is a schematic structural diagram 2 of a chip packaging method according to embodiments of the present disclosure.
Figure 3:
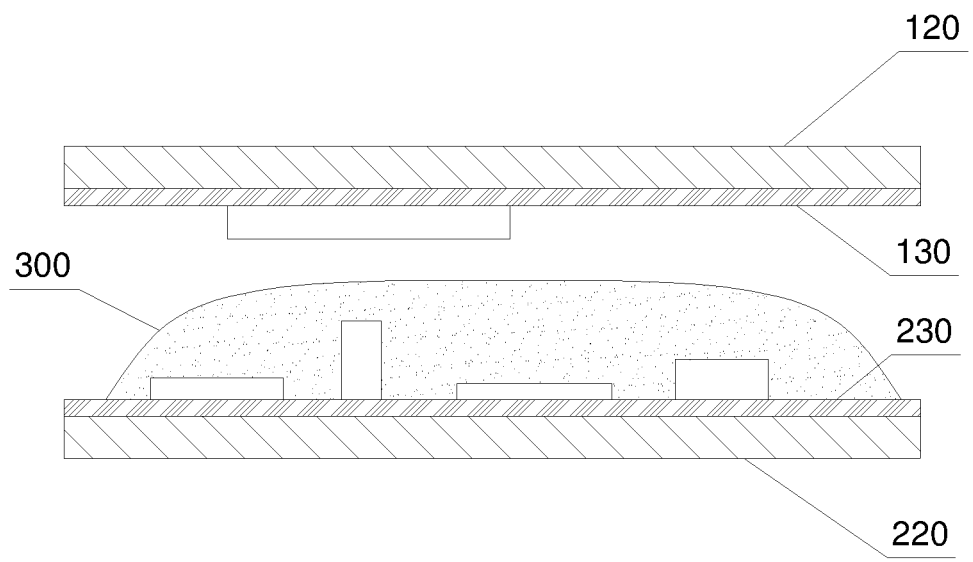
FIG. 3 is a schematic structural diagram 3 of a chip packaging method according to embodiments of the present disclosure.
Figure 4:
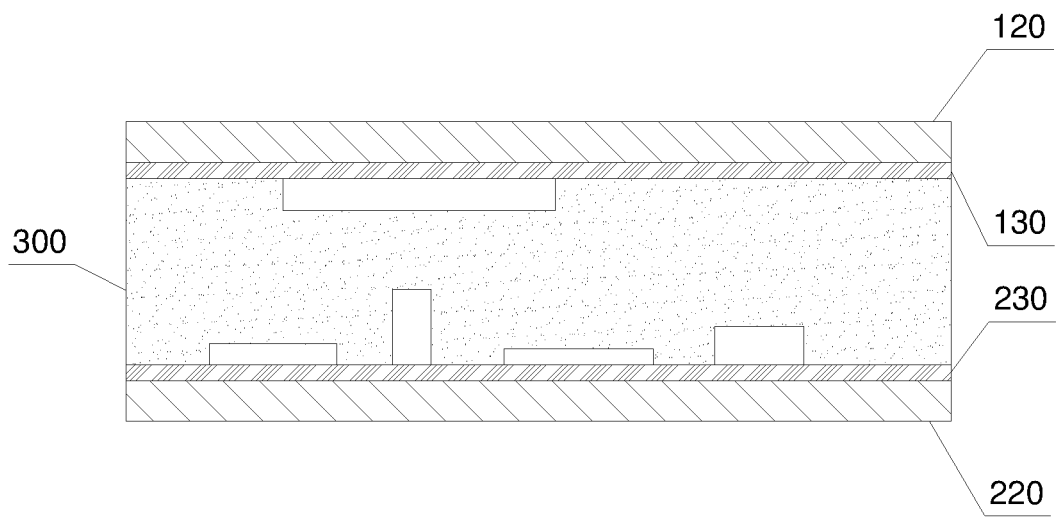
FIG. 4 is a schematic structural diagram 4 of a chip packaging method according to embodiments of the present disclosure.
Figure 5:
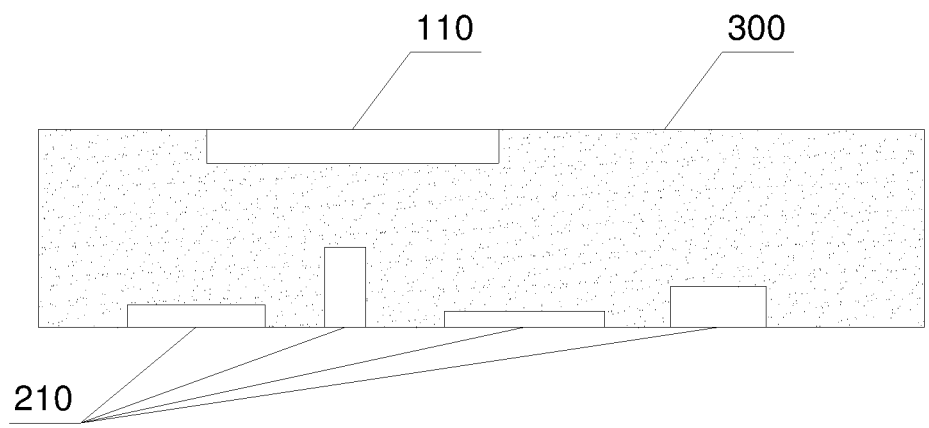
FIG. 5 is a schematic structural diagram 5 of a chip packaging method according to embodiments of the present disclosure.

The main steps of the integrated circuit system packaging method include:

(1) curing: in which as shown in FIG. 2, the first carrier 120 and the second carrier 220 are oppositely provided, and the first device set 110 on the first carrier 120 and the second device set 210 on the second carrier 220 are both located between the carrier 120 and the second carrier 220; as shown in FIG. 3, a molding material 300 is provided between the first carrier 120 and the second carrier 220; and as shown in FIG. 4, the first device set 110 and the second device set 210 are in contact with the molding material 300 respectively, and the molding material 300 is cured so that the first device set 110 and the second device set 210 are mounted at two sides of the molding material 300, respectively;

(2) detaching: in which as shown in FIG. 5, the first carrier 120 is detached from the first device set 110 and the molding material 300, and the second carrier 220 is detached from the second device set 210 and the molding material 300;

(3) connecting: in which as shown in FIG. 6, connection holes 310 are formed in the molding material 300; as shown in FIG. 7, a conductive layer 400 is fabricated in such a way that the conductive layer 400 extends into the connection holes 310, and the conductive layer 400 enables the first device set 110 to be electrically coupled to the second device set 210. The conductive layer 400 extending into the connection holes 310 may be attached only to the inner walls of the connection holes 310, or may completely or partially fill the connection holes 310.

The conventional circuit board is provided with devices on only a single side. In the present disclosure, the first device set 110 and the second device set 210 are respectively provided on two sides of the molding material 300, thus the devices which may be accommodated are greatly increased, and the devices at the two sides may be electrically connected with each other through the connection holes 310, increasing connection points, improving transmission bandwidth and operation speed, and enabling the obtained integrated circuit system with high performance. Moreover, the devices at the two sides of the molding material 300 are electrically connected to each other by means of the connection holes 310, and the connection holes 310 are provided in the molding material 300, occupying no extra space; in particular, for ultra-thin circuit boards, flexible circuit boards, and circuit board of wearable devices, etc., using the method of the present disclosure can well maintain the ultra-thin and flexible characteristics of the integrated circuit system.

As needed, as shown in FIGS. 1 to 4, the first device set 110 is mounted to the first carrier 120 by the thermosensitive adhesive material 130, 230, and in the detaching step, the thermosensitive adhesive material 130, 230 is heated or cooled to make the first carrier 120 detached from the first device set 110; or/and, the second device set 210 is mounted to the second carrier 220 by the thermosensitive adhesive material 130, 230, in the detaching step, the thermosensitive adhesive material 130, 230 is heated or cooled to make the second carrier 220 detached from the second device set 210. As needed, by using the thermosensitive adhesive material, the first device set 110 or the second device set 210 may be adhered, or the first device set 110 and the second device set 210 may be adhered simultaneously, and when heated or cooled, the first carrier 120 is detached, or the second carrier 220 is detached, or the first carrier 120 and the second carrier 220 are simultaneously detached, for ready for the connecting step.

Figure 8:
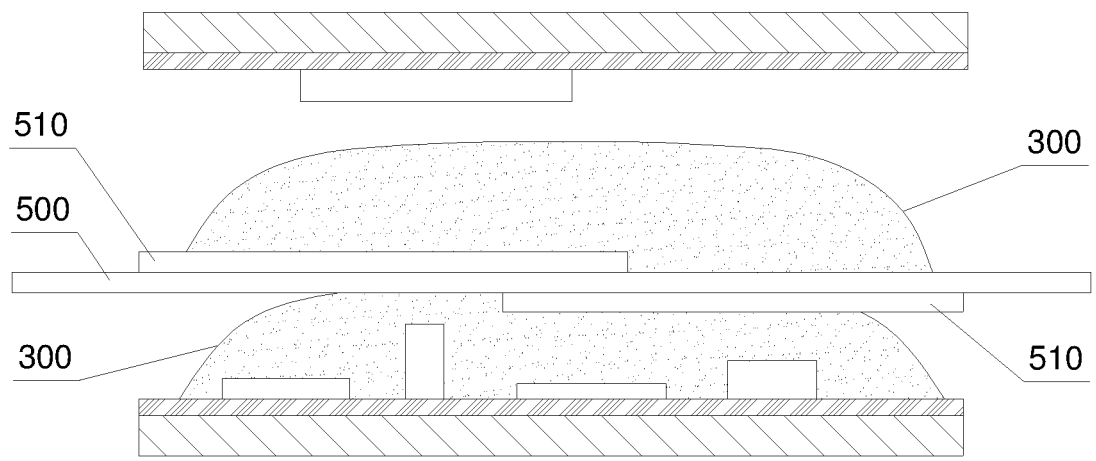
FIG. 8 is a schematic structural diagram 8 of a chip packaging method according to embodiments of the present disclosure.
Figure 9:
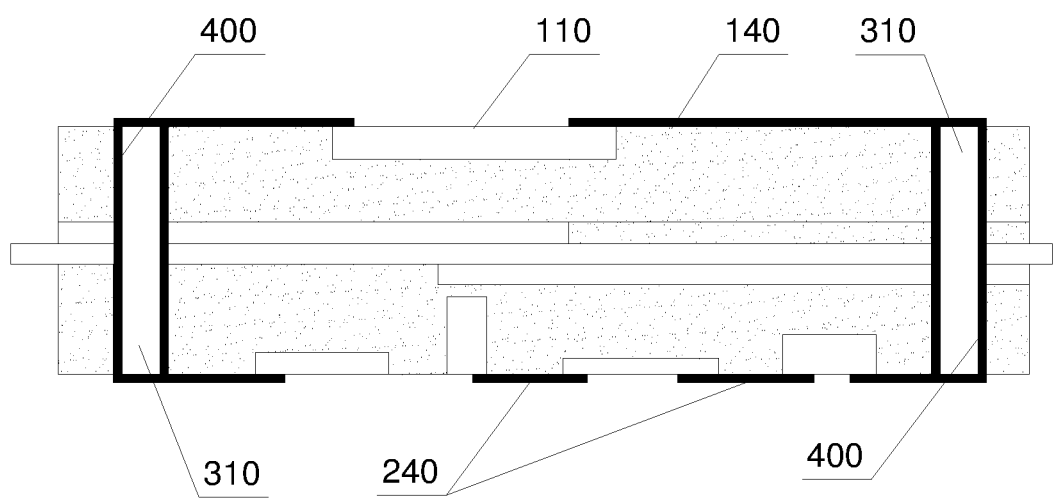
FIG. 9 is a schematic structural diagram 9 of a chip packaging method according to embodiments of the present disclosure.

When the intermediate layer 500 is required to be provided, in the curing step, as shown in FIG. 8, an intermediate layer 500 is provided between the first carrier 120 and the second carrier 220, and the molding material 300 is distributed between the first carrier 120 and the intermediate layer 500 and between the second carrier 220 and the intermediate layer 500, and the molding material 300 is cured so that the intermediate layer 500 is embedded in the molding material 300, without occupying extra space. Adding the intermediate layer 500 before the molding material 300 is cured can improve the performance of the integrated circuit system, and can impart different characteristics to the intermediate layer 500 as needed, so that the final highly-integrated circuit system can obtain better characteristics. Then, the first circuit layer 140 and the second circuit layer 240 are formed at two sides of the substrate, as shown in FIG. 9. The illustrated connection holes 310 and conductive layer 400 is directly connected with the first circuit layer 140, the second circuit layer 240 and the base circuit layer 510, which is merely simplified description, and in other embodiments, there may be more complicated connecting possibilities. The connection holes 310 and the conductive layer 400 may be only connected with any one or two circuit layers of the first circuit layer 140, the second circuit layer 240 and the base circuit layer 510, and then the connection holes 310 are electrically connected through the conductive layer 400 on the surface of the substrate, and thus several circuit layers are electrically connected.

As shown in FIGS. 7 and 9, the pins of the devices of the first device set 110 are oriented toward the first carrier 120, and the pins of the devices of the second device set 210 are oriented toward the second carrier 220. In this way, after the step of detaching, the pins of the devices of the first device set 110 and the pins of the devices of the second device set 210 are exposed at two sides of the substrate, so as to facilitate fabrication of the first circuit layer 140 and the second circuit layer 240 at the two sides of the substrate respectively, to make the first circuit layer 140 electrically connected with the first device set 110 and the second circuit layer 240 electrically connected with the second device set 210. The first circuit layer 140 may be directly formed on the surface of the molding material 300, or after the first circuit layer 140 is provided on another circuit board, the first device set is electrically connected to the first circuit layer 140 of the circuit board through the pins of the devices; the second circuit layer 240 may be directly formed on the surface of the molding material 300, or after the second circuit layer 240 may be provided on another circuit board, the second device set is electrically connected to the second circuit layer 240 of the circuit board through the pins of the devices. Further, the first device set 110 and the second device set 210 are embedded in the molding material 300. After curing, the two sides of the molding material 300 are flat, which facilitates stacking other circuit boards on the side or stacking a plurality of integrated circuit systems.

In addition, the first circuit layer 140 is provided with a first connection port, and the devices are mounted onto the first circuit layer 140 to make the devices electrically connected to the first connection port; the first circuit layer 140 has an extended function due to the pre-provided first connection port, and after the first circuit layer 140 is fabricated, the device can be repositioned according to different needs. Or/and, the second circuit layer 240 is provided with a second connection port, and the devices are mounted onto the second circuit layer 240 to make the devices electrically connected to the second connection port. The second circuit layer 240 has an extended function due to the pre-provided second connection port. After the second circuit layer 240 is fabricated, the device can be mounted according to different needs, wherein the device can be a chip or an electronic component. The device may be a chip or an electronic component, and the chip includes but not limited to a bare die or a chip with packaged bare die.

Furthermore, the first device set 110 or/and the second device set 210 includes an invalid device configured for equalizing the density of the devices of the first device set 110 or/and the second device set 210 distributed in the molding material 300, to avoid warpage of the molding material 300. For the traditional circuit board, the device composition of the first device set and the second device set are often depended on the functions to be implemented, and the size, dimension and number may vary greatly. If only valid devices are used, different thermo-mechanical stresses may be induced at two sides of the formed substrate due to uneven device material distribution, and there may be warpage during the fabrication process. In the present disclosure, in addition to setting the first device set 110 and the second device set 210 to realize the circuit function of the whole system, an invalid chip is further added, wherein the invalid chip can offset the difference in volume and occupied area between the different devices, enabling uniform device occupied density of the surface of the entire molding material 300, and avoiding occurrence of the warpage. The first device set 110, or the second device set 210, or both the first device set 110 and the second device set 210 may be provided with an invalid chip. The arrangement positions of the devices of the first device set 110 and the second device set 210 may be pre-designed, and then an invalid device is added, and the position of the invalid device is simulated to facilitate equalization and avoiding warpage. Invalid devices are not shown in the figures.

The at least two first device sets 110 are provided on the first carrier 120, and the at least two second device sets 210 are provided on the second carrier 220. After the curing step, the detaching step and the connecting step, the first device set 110, the second device set 210 and the molding material 300 constitute a substrate. After the processes of curing, detachment and connecting and fabrication of the first and second circuit layers 240 are completed, the substrate is finally cut into at least two circuit boards. In this manner, the devices of the first device set 110 and the second device set 210 are firstly mounted, with a plurality of the first device sets 110 and the second device sets 210 simultaneously fixedly mounted by the molding material 300, and the connection holes 310 and the conductive layer 400 are simultaneously fabricated. Finally, the board is cut into the circuit boards of required size, achieving high production efficiency.

There are at least two first device sets 110, and there are at least two second device sets 210, and each circuit board includes at least one first device set 110 or at least one second device set 210. It is also possible to provide only one first device set 110 or only one second device set 210, and as required, the different printed circuit boards after cutting respectively include several devices in the first device set 110, or several devices in the second device set 210.

The first device set 110, the second device set 210 and the molding material 300 constitute a substrate. After the detaching step, the first circuit layer 140 and the second circuit layer 240 are respectively formed at two sides of the substrate, to make the first circuit layer 140 electrically connected to the first device set 110, and the second circuit layer 240 electrically connected to the second device set 210. The first circuit layer 140, the first device set 110, the second circuit layer 240, and the second device set 210 are electrically connected to expand circuit functions. As needed, when the first device set 110 is provided on the first carrier 120, the first device sets 110 may be electrically connected to each other, and the first circuit layer 140 may be increased to extend the original connection; or no electrical connection is presented between the first device sets in advance, and electrical connection is achieved through the first circuit layer 140. When the second device set 210 is provided on the second carrier 220, the second device sets 210 may be electrically connected to each other, and the second circuit layer 240 may be increased to extend the original connection; or no electrical connection is presented between the second device set 210 in advance, and electrical connections are achieved through the second circuit layer 240.

The technical features of the above embodiments may be arbitrarily combined. For the sake of brevity of description, not all possible combinations of the technical features in the above embodiments are described. However, as long as there is no contradiction in the combination of these technical features, it is considered to be in the scope described in this specification.

The above embodiments are merely illustrative of several embodiments of the present disclosure, and the description thereof is relatively specific and detailed, but it is not to be construed as limiting the scope of the disclosure. It should be noted that a number of variations and modifications may be made by those skilled in the art without departing from the concept of the disclosure, which all fall within the scope of protection of the present disclosure. Therefore, the scope of the disclosure should be determined by the appended claims.

The invention claimed is:

1. An integrated circuit system packaging method, comprising steps of:
   curing, comprising:
      providing a first carrier and a second carrier opposite to each other, wherein a first device set of the first carrier and a second device set of the second carrier are both located between the first carrier and the second carrier,
      providing a molding material between the first carrier and the second carrier, wherein the first device set and the second device set are respectively in contact with the molding material, and
      curing the molding material, so that the first device set and the second device set are respectively mounted at two sides of the molding material;
   detaching, comprising:
      detaching the first carrier from the first device set and the molding material, and
      detaching the second carrier detached from the second device set and the molding material; and
   connecting, comprising:
      forming connection holes in the molding material, and forming a conductive layer in such a way that the conductive layer extends into the connection holes, wherein the conductive layer enables the first device set to be electrically connected with the second device set,
   further comprising:
      providing, in the curing step, an intermediate layer between the first carrier and the second carrier, such that the molding material is distributed between the first carrier and the intermediate layer, and between the second carrier and the intermediate layer, and
      curing the molding material to make the intermediate layer embedded in the molding material.

2. The integrated circuit system packaging method according to claim 1, wherein the first device set is mounted to the first carrier by a thermosensitive adhesive material, and in the detaching step, the thermosensitive adhesive material is heated or cooled to detach the first carrier from the first device set; and
   the second device set is mounted to the second carrier by a thermosensitive adhesive material, and in the detaching step, the thermosensitive adhesive material is heated or cooled to detach the second carrier from the second device set.

3. The integrated circuit system packaging method according to claim 1, wherein the intermediate layer is at least one of a flexible circuit board; or,
   a stack of at least two layers of flexible circuit boards; or
   a shielding layer; or
   an electronic component, with the intermediate layer made to be electrically connected to the first device set or the second device set.

4. The integrated circuit system packaging method according to claim 1, wherein the intermediate layer is provided with a base circuit layer, and the base circuit layer is electrically connected to the first device set, or the base circuit layer is made to be electrically connected to the second device set.

5. The integrated circuit system packaging method according to claim 1, further comprising:
   making the first device set, the second device set and the molding material constitute a substrate, and
   fabricating, after the detaching step, a first circuit layer and a second circuit layer respectively at two sides of the substrate, wherein the first circuit layer is electrically connected to the first device set and the second circuit layer is electrically connected to the second device set.

6. The integrated circuit system packaging method of claim 5, wherein pins of devices of the first device set are oriented toward the first carrier, and pins of device of the second device set are oriented toward the second carrier.

7. The integrated circuit system packaging method according to claim 5, wherein the first circuit layer is provided with a first connection port, and devices are mounted onto the first circuit layer to make the devices electrically connected to the first connection port; or
   the second circuit layer is provided with a second connection port, and devices are mounted onto the second circuit layer to make the devices electrically connected to the second connection port.

8. The method of packaging an integrated circuit system according to claim 1, further comprising:
   fabricating, before the curing step, a first circuit layer on the first carrier, and providing the first device set on the first circuit layer, the first circuit layer being electrically connected to the first device set, and in the detaching step, making the first circuit layer and the first device set both separated from the first carrier, and mounting the first circuit layer and the first device set together on the molding material; or/and
   fabricating, before the curing step, a second circuit layer on the second carrier, and providing the second device set on the second circuit layer, the second circuit layer being electrically connected to the second device set, and making, in the detaching step, the second circuit layer and the second device set both detached from the carrier, and mounting the second circuit layer and the second device set together on the molding material.

9. The integrated circuit system packaging method according to claim 1, wherein the first device set, the second device set, and the molding material constitute a substrate, the substrate having an area greater than 10,000 square centimeters.

10. The integrated circuit system packaging method according to claim 9, wherein the first device set or/and the second device set comprises an invalid device, wherein the invalid device is configured to make uniform a density that devices of the first device set or/and the second device set are distributed in the molding material, to avoid warpage of the molding material.

11. The integrated circuit system packaging method according to claim 9, wherein the first device set and the second device set at the two sides of the molding material are staggered, to uniform a density that devices of the first device set and the second device set are distributed at the two sides of the molding material, to avoid warpage of the molding material.

12. The integrated circuit system packaging method according to claim 1, wherein at least two first device sets are provided on the first carrier, at least two second device sets are provided on the second carrier, and after the curing step, the detaching step and the connecting step, the first device set, the second device set and the molding material constitute a substrate, and the substrate is cut into at least two circuit boards.

13. An integrated circuit system, comprising: a first device set detached from a first carrier, a second device set detached from a second carrier, and a cured molding material,
wherein the molding material is located between the first device set and the second device set, the first device set and the second device set are in contact with the molding material, the first device set and the second device set are respectively mounted at two sides of the molding material, and the molding material is provided with connection holes and a conductive layer, wherein the conductive layer extends into the connection holes, and the conductive layer enables the first device set to be electrically connected to the second device set,
further comprising providing an intermediate layer between the first device set and the second device set, wherein the intermediate layer is embedded in the molding material.

14. The integrated circuit system of claim 13, wherein the first device set, the second device set and the molding material constitute a substrate, a first circuit layer and a second circuit layer are respectively provided at the two sides of the substrate, the first circuit layer is electrically connected to the first device set, and the second circuit layer is electrically connected to the second device set.

15. The integrated circuit system of claim 13, wherein said first circuit layer is provided with a first connection port, devices are mounted to the first circuit layer, and the devices are electrically connected to the first connection port; or
the second circuit layer is provided with a second connection port, devices are mounted to the second circuit layer, and the devices are electrically connected to the second connection port.

16. The integrated circuit system of claim 13, wherein the intermediate layer is a flexible circuit board; or
the intermediate layer is formed by stacking at least two layers of flexible circuit boards; or
the intermediate layer is a shielding layer; or
the intermediate layer itself constitutes an electronic component with the intermediate layer made to be electrically connected to the first device set or the second device set.

17. The integrated circuit system of claim 13, wherein the intermediate layer is provided with a base circuit layer, wherein the base circuit layer is electrically connected to the first device set, or the base circuit layer is electrically connected to the second device set.

18. The integrated circuit system according to claim 13, wherein the first device set or/and the second device set comprise an invalid device, and the invalid device is configured to uniform a density that devices of the first device set or/and the second device set are distributed at the two sides of the molding material to avoid warpage of the molding material.

19. The integrated circuit system packaging method according to claim 1, wherein at least one of the first device set is mounted to the first carrier or the second device set is mount to the second carrier by a thermosensitive adhesive material, and in the detaching step, the thermosensitive adhesive material is heated or cooled to detach at least one of the first carrier from the first device set and the second carrier from the second device set.

* * * * *